United States Patent [19]

Dalley et al.

[11] 4,228,412

[45] Oct. 14, 1980

[54] ELECTRICAL SWITCHING APPARATUS AND ENERGIZING CIRCUITS THEREFOR

[75] Inventors: Robert J. Dalley, Camberley; Robert D. Owen, Farnborough; George S. Parmenter, Hartley Wintney, all of England

[73] Assignee: The Solartron Electronic Group Limited, Farnborough, England

[21] Appl. No.: 884,309

[22] Filed: Mar. 7, 1978

[30] Foreign Application Priority Data

Mar. 8, 1977 [GB] United Kingdom ............... 09602/77

[51] Int. Cl.² .................. H01H 1/66; H01H 51/00
[52] U.S. Cl. .................. 335/152; 335/112; 335/151; 361/400
[58] Field of Search .............. 335/151, 156, 152, 153, 335/154, 112; 361/400, 403, 417, 424

[56] References Cited

U.S. PATENT DOCUMENTS

| 3,408,602 | 10/1968 | McWhorter | 335/112 |
| 3,582,844 | 6/1971 | Launt | 335/112 |
| 3,812,439 | 5/1974 | Parmenter | 335/152 X |

Primary Examiner—Fred L. Braun

[57] ABSTRACT

A scanner unit on a double-sided printed circuit board has reed switches on one face and coils on the other. The copper patterns include large screening pads beneath the reed switches and the coils. These pads distribute heat evenly along the switches to minimize thermally-induced E.M.F.'s, and provide electrostatic screening. An energizing circuit for the coils provides a single, long pulse several times larger in magnitude than the minimum required for relay actuation, followed by a series of shorter pulses of the same magnitude, but having a time-average magnitude equal to the relay holding current. This avoids the need for a voltage-dropping resistor and power wastage therein.

13 Claims, 7 Drawing Figures

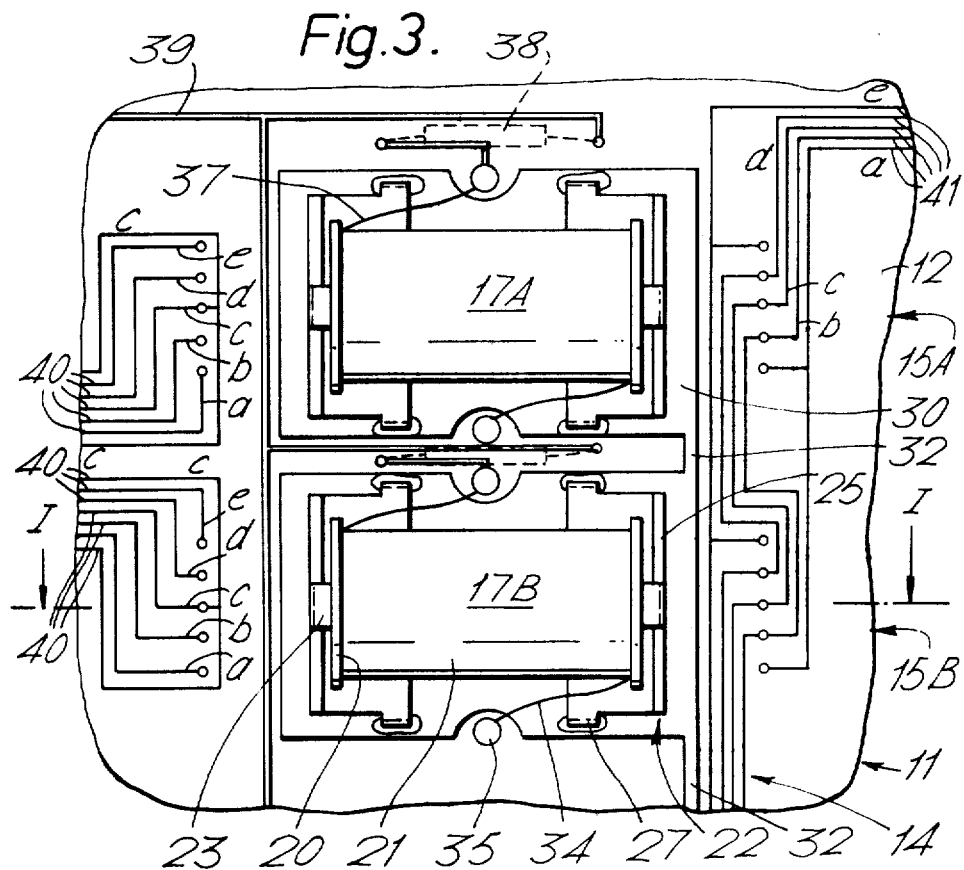
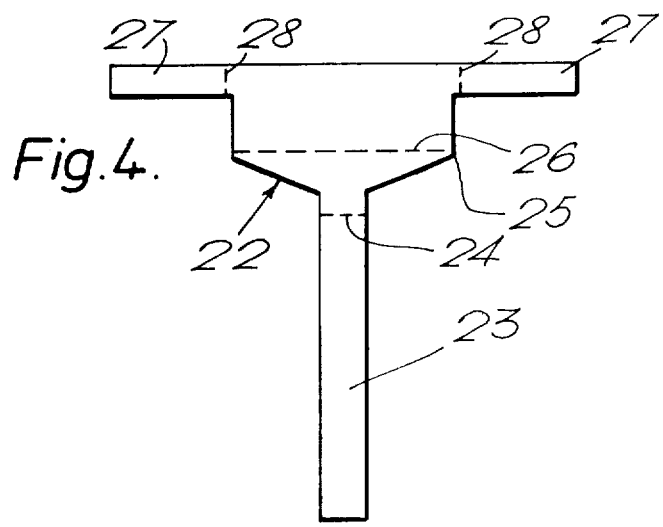

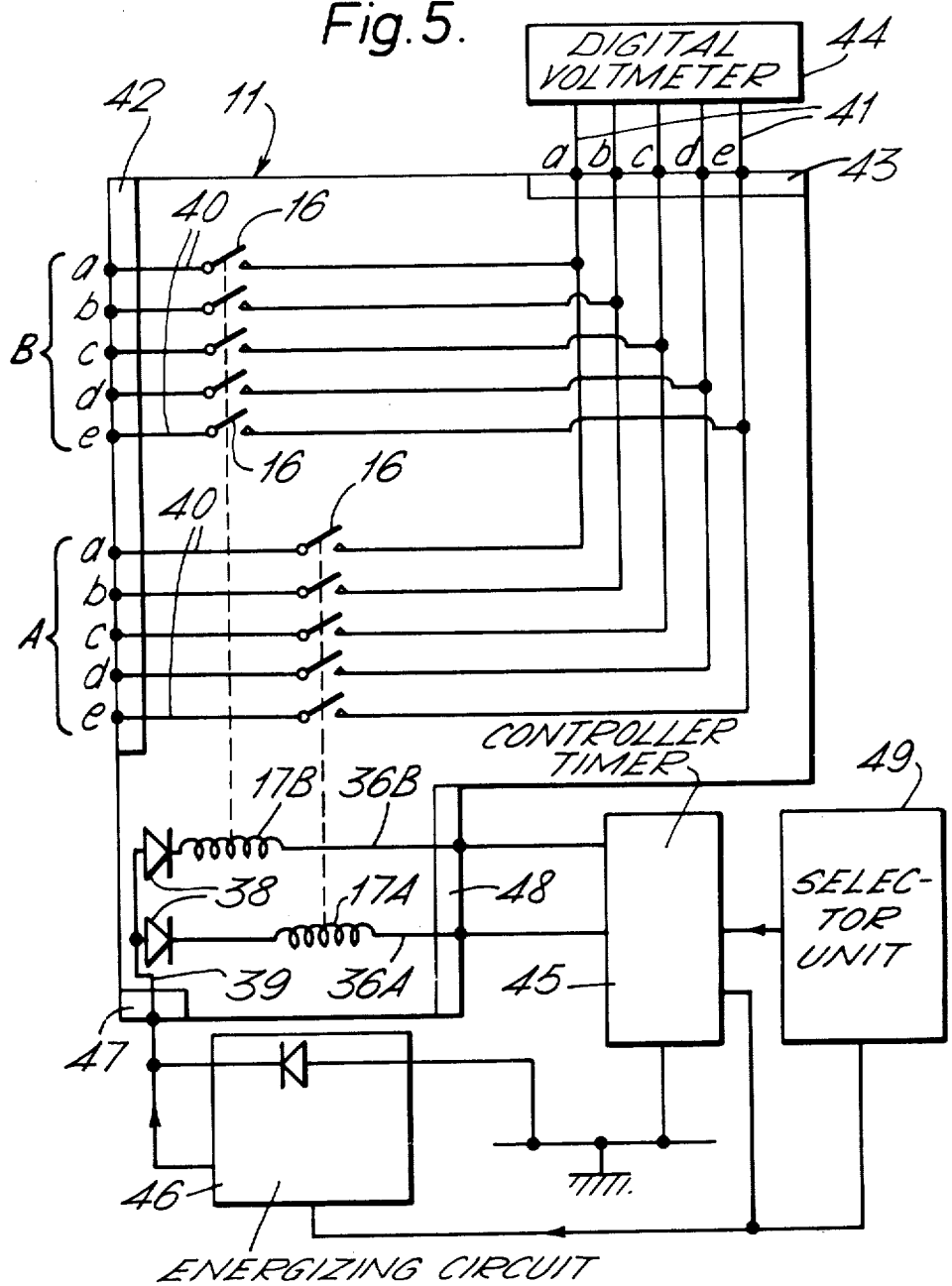

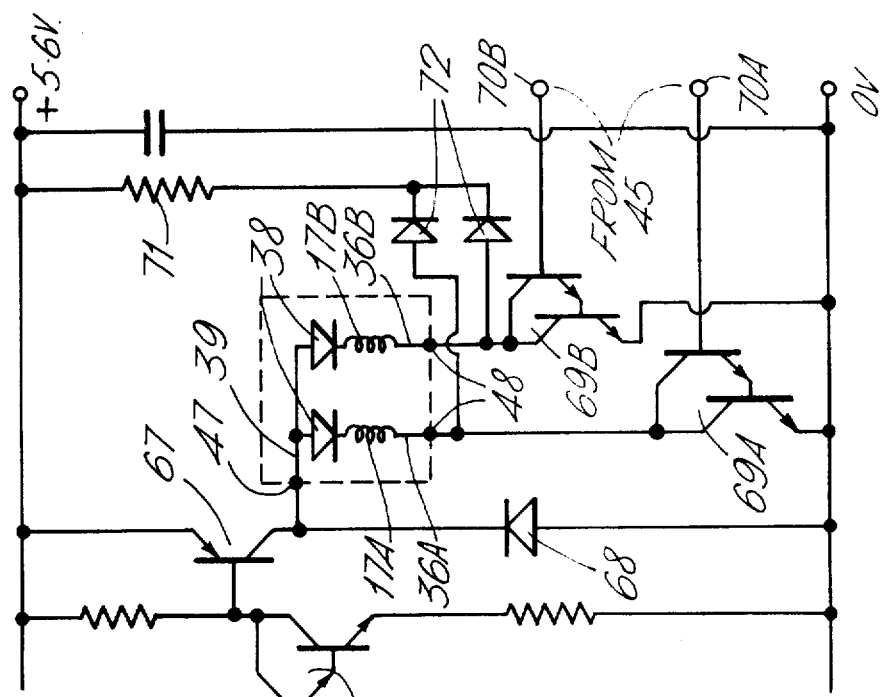
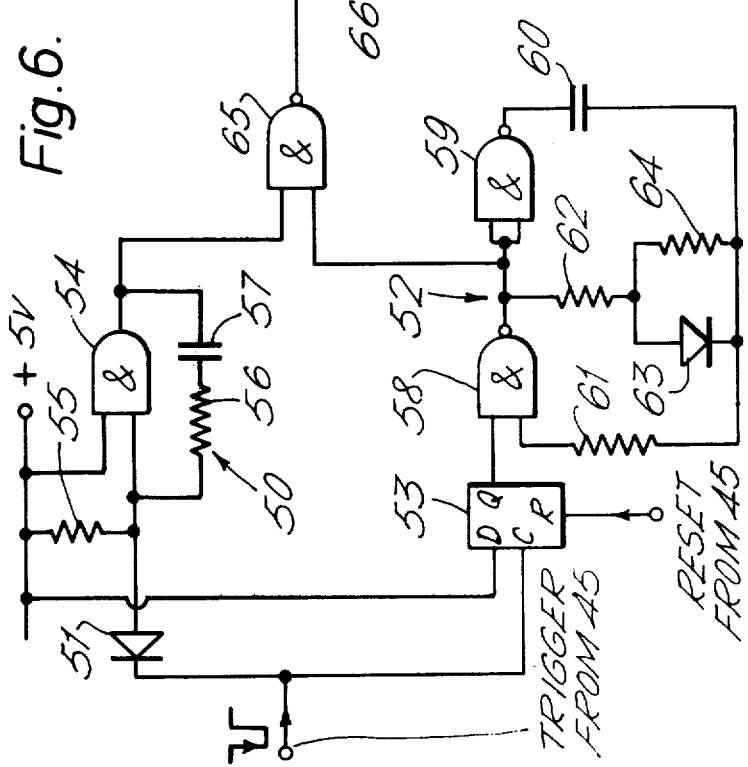
Fig. 6.
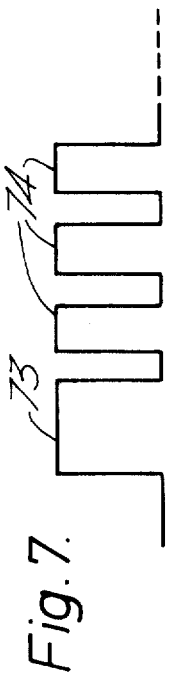
Fig. 7.

ELECTRICAL SWITCHING APPARATUS AND ENERGIZING CIRCUITS THEREFOR

This invention relates to electrical switching apparatus including reed relays, and to energising circuits for effecting switching in such apparatus. It is particularly, though not exclusively, concerned with apparatus and circuits for use in scanner units.

It is known for scanner units to employ reed relays for selectably or sequentially connecting each one of a plurality of analogue input signals to an output, for example for measurement purposes. In a known form reed relay, the reeds comprise two elongated flexible electrical contacts of magnetic material, which are sealed within a glass capsule and are so secured at the opposite ends of the capsule that respective free end portions of the reeds lie alongside one another in spaced-apart relationship: this assembly of the reeds and the capsule will hereinafter be referred to as a reed contact unit. The reed contact unit is typically mounted within a tubular electric coil, with the reeds substantially parallel to the axis of the coil, so that magnetic flux induced by the passage of an electric current through the coil causes the reeds to attract one another, thereby establishing electrical contact between them.

The passage of an electric current through the coil also generates heat which, in this known form of reed relay, is transmitted to the reeds. It has been found that, in operation, differences between the respective temperatures of the reeds arise, particularly where there is asymmetry in the arrangement of the reeds within the coil: typically, where the coil is dissipating three quarters of a watt, a temperature difference between the reeds of about one Centigrade degree may arise. This temperature difference may be transferred to the respective junctions between the reeds (typically of ferrous material) and the circuitry (typically including copper) of which they form part, and can, in turn, lead to the production of a thermal E.M.F. of up to forty microvolts. This is particularly disadvantageous in the context of a scanner unit, where the reed relay is being used to switch low voltages which are to be measured in a sensitive electrical measuring instrument such as a digital voltmeter.

Moreover, in the case of a scanner unit it is desirable that the input signals be isolated from the signals used to energise the relays, in order to reduce the possibility of interference between the relay energising signals and the input signals and vice versa.

One arrangement intended to satisfy these requirements is described in our UK Patent Specification No. 1,384,528, and involves two printed circuit boards held substantially parallel to one another, with the coils mounted on one of the boards in the space between them, and the reed contact units mounted on the other board (outside the coils) opposite their respective coils. However, this arrangement results in a relatively thick unit, and requires two printed circuit boards and their associated connectors.

According to one aspect of the present invention, there is provided electrical switching apparatus for an electrical scanner unit, wherein a printed circuit board carries a plurality of reed relays each comprising an electric coil and at least one reed contact unit, wherein the coils are disposed on one surface of the board and the contact units are disposed on the other surface opposite their respective coils, and wherein screening means of substantially non-magnetic, electrically- and thermally-conductive material is disposed between each contact unit and its respective coil.

The screening means may be of copper, and may be disposed on said other surface of the board.

Preferably, the screening means comprises part of the conductive cladding of the circuit board. Furthermore, the screening means may include loops enclosing respective points of electrical connection of the reeds to the circuit board.

The board may be a double-sided printed circuit board, and in these circumstances the screening means may include part of the conductive cladding on said one surface.

Each coil may have a plurality of reed contact units associated therewith, and in this case a single, common screening means may be provided between each coil and its associated reed contact units.

The coils may be tubular.

Each reed relay may include magnetic circuit means for transmitting the magnetic flux produced by the coil to the reed contact unit, and comprising two pole-pieces respectively positioned at opposite axial ends of the coil. These pole-pieces may also serve to mount the coil on the board.

Preferably the axis of each coil is parallel to the plane of the board, and the pole-pieces comprise respective plate-like members each lying in a plane perpendicular to said axis and each having a first bent-over portion which extends axially into the coil and a second bent-over portion which extends substantially parallel to said axis and towards the second bent-over portion of the other pole-piece, the reed contact unit being positioned on said other surface of the board parallel to and adjacent a line joining the second bent-over portions.

Another problem has been encountered in the energisation of electromagnetically actuated devices such as reed relays. Such devices generally require a larger energising current to actuate them than that required to hold them in the actuated condition. Furthermore, it has been found that the speed of actuation may be increased by supplying an energising voltage pulse substantially larger than the minimum required for actuation, and thereafter supplying a voltage of sufficient magnitude only to maintain the device in its actuated condition. The reduction in voltage magnitude involved has previously been obtained by including a resistor in series with the energising coil of the device to reduce the coil voltage progressively as the current increases. However, this is wasteful, since the resistor dissipates energy as heat.

According to another aspect of this invention there is provided an electromagnetically actuated device and a circuit for energising said device comprising means for generating a train of discrete current pulses, the first pulse in the train having a magnitude at least equal to, and preferably substantially greater than, the minimum required to initiate actuation of the device and the succeeding pulses in the train having a time-average magnitude at least equal to the minimum required to maintain actuation of the device.

The first pulse may have a duration at least as long as the period required for the device to attain its actuated condition.

Preferably said succeeding pulses are equal in peak magnitude to said first pulse.

The generating means may comprise a monostable circuit for generating said first pulse and an astable circuit for generating said succeeding pulses.

Electrical switching apparatus and an energising circuit therefor in accordance with this invention for use in an electrical scanner unit will now be described, by way of example, with reference to the accompanying drawings, in which:

FIGS. 2 and 3 are fragmentary plan views of the upper and lower surfaces of the apparatus;

FIG. 4 is a plan view of a pole piece of the reed relay of FIG. 1;

FIG. 5 is a simplified circuit diagram of the scanner unit;

FIG. 6 is a schematic diagram of the energising circuit; and

FIG. 7 is a waveform diagram of the output signal of the energising circuit.

Figure 1:
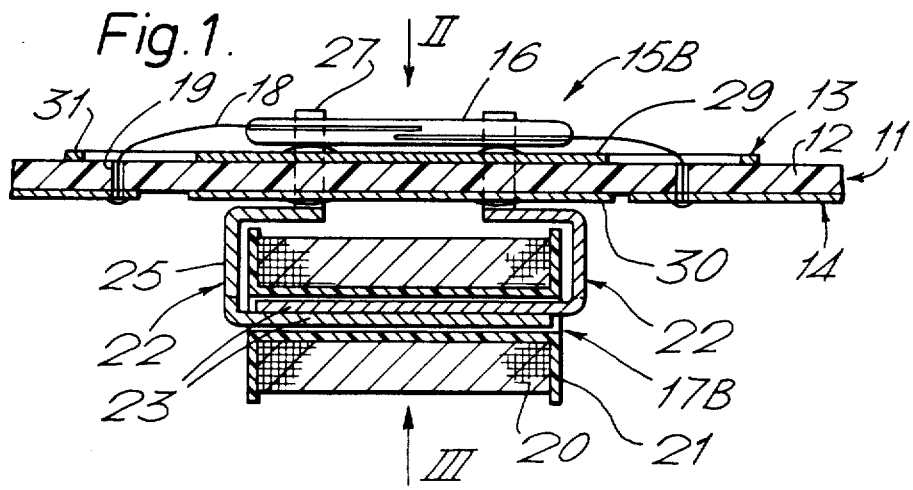
FIG. 1 is a cross-sectional side view (not to scale) of a reed relay forming part of the apparatus.
Figure 2:
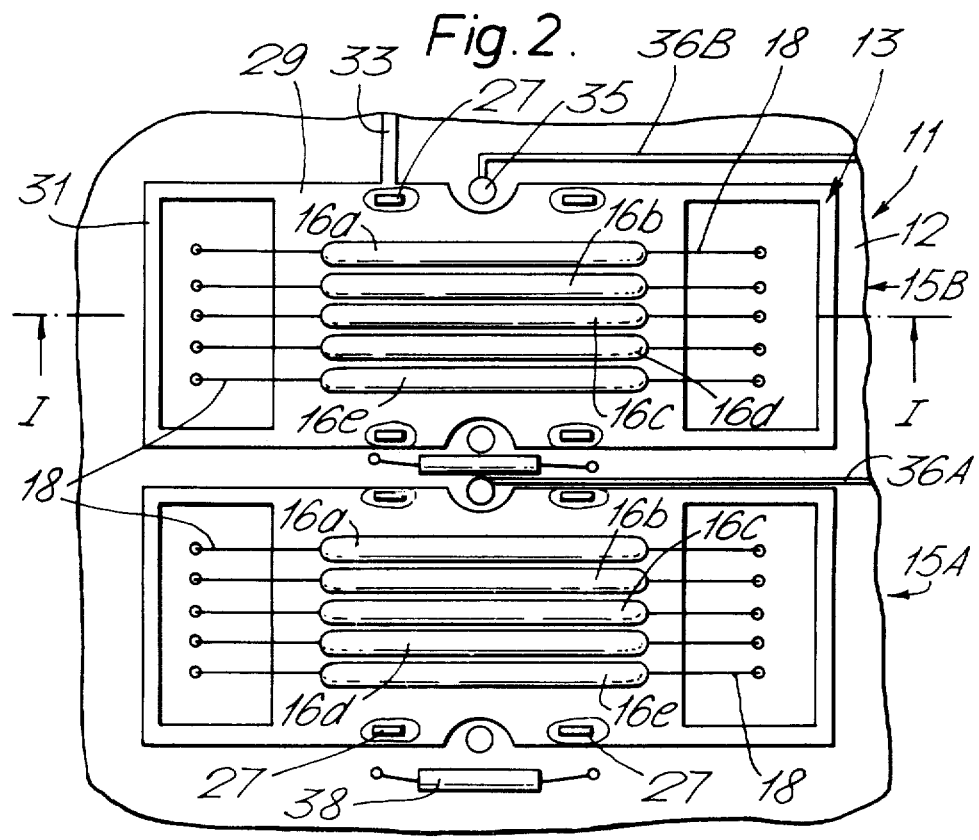

Referring to FIGS. 1, 2 and 3, a double-sided printed circuit board 11 has an insulating substrate 12 carrying copper printed circuit patterns 13 and 14 on its upper and lower surfaces (as viewed in FIG. 1) respectively. The printed circuit patterns 13 and 14 provide connections to multi-pole reed relays 15 also carried by the board 11. Each reed relay 15 comprises five reed contact units 16 mounted on the upper surface of the board 11 and a coil 17, for actuating the respective group of five units 16, mounted on the lower surface of the board 11, parallel to and directly under the units 16. The reed contact units 16 are secured to the board by their leads 18 which pass through respective holes 19 in the board 11 and are soldered to the lower printed circuit pattern 14.

Each coil 17 comprises wire 20 pile wound on a hollow coil former 21 which is held by two plate-like pole pieces 22. Each pole piece 22 is generally T-shaped, as shown in FIG. 4, and is stamped from mild steel sheet. The stem 23 of one pole piece 22 is bent over along a line 24 at right angles to the head portion 25, and inserted into the hollow of the coil former 21. The stem 23 of the other pole piece 22 is similarly bent over, but slightly displaced, so that when it is inserted into the hollow of the coil former 21 it overlies the stem 23 of the first pole piece 22, as shown in FIG. 1. The upper parts of the head portions 25 of the two pole pieces 22 are bent over along a line 26 in the same direction as, and parallel to, the stems 23. Two arms 27 of each pole-piece 22 are bent up along lines 28 to extend through respective holes in the board 11, and are soldered to large pads 29 and 30 in the printed circuit patterns 13 and 14 respectively.

As shown in FIG. 2, each pad 29 provides a layer of copper covering the whole of the area of the board 11 occupied by the respective group of reed contact units 16. In addition, each pad 29 has a loop 31 extending from each side and surrounding the leads 18 of the units 16 and the holes 19 where those leads extend through the board 11.

Similarly, and as shown in FIG. 3, each pad 30 provides a layer of copper over the whole area occupied by the respective coil 17. The pads 30 of adjacent reed relays 15 are connected by printed circuit tracks 32 in the pattern 14, and the pads 29 and 30 are electrically connected via the arms 27 of the pole pieces 22. Thus all the pads 29 and 30 are at a common potential, and a track 33 (FIG. 2) in the pattern 13 provides for their connection to an electrical screen point.

One lead 34 of each coil 17 is connected via a respective through-hole connection 35 to a respective track 36 in the pattern 13. The other lead 37 is coupled by a respective series diode 38 to a common track 39 in the pattern 14.

In operation, an energising voltage is supplied to the common track 39, and one of the coils 17A, 17B selected for energisation by appropriate selection and connection of the respective track 36A, 36B to earth potential. It is to be understood that only two reed relays 15 are described and shown for clarity, and in practice a larger number, typically sixteen, would be provided. Magnetic flux induced by the energised coil 17 is concentrated and directed by the pole pieces 22 into the vicinity of the board 11 between the coil 17 and the reed contact units 16. The board 11 and the pads 29 and 30 are magnetically transparent, so the field can extend through them to actuate the reed contact units 16 and establish electrical contact between their leads 18.

Since the reed contact units 16 are mounted outside the coils 17, heating of the units 16 by the coils 17 is substantially reduced. In addition, the pad 29 (and, to a lesser extent, the pad 30) acts as an isothermal shield to maintain the units 16 and their leads 18 at a substantially uniform temperature along the whole of their length, so that any E.M.F.s thermally induced at the junctions of the leads 18 with the pattern 14 tend to balance out. Furthermore, both pads 29 and 30 provide electrostatic shielding of the units 16 against spurious signals induced by switching of current through the coils 17.

Thermal gradients between the ends of each reed contact unit 16 may be further minimised by mounting the board 11 horizontally.

Referring again to FIG. 3, the lower printed circuit pattern 14 includes a respective set of five conductor tracks 40a to 40e for each group of five reed contact units 16a to 16e. The apparatus illustrated is suitable for switching four signals simultaneously, each signal being switched by a respective one of four of the units 16a, 16b, 16d and 16e. The fifth unit 16c (the centre one) in each group switches the signal screen line, and, to improve the noise immunity of the apparatus, the track 40c for this unit is triplicated, the tracks 40a and 40b extending between and parallel to the first and second limbs of the track 40c, and the tracks 40d and 40e extending between the second and third limbs.

One lead 18 of each reed contact unit 16 in a group is connected to the respective track 40 in the respective set of tracks. The other lead 18 of each unit 16 is connected to a respective one of five common tracks 41a to 41e in the pattern 14. Thus, the reed contact units 16a in each reed relay 15A and 15B are both coupled to the common track 41a, as shown in FIG. 3. Thus selective energisation of one of the coils 17 causes the associated group of reed contact units 16 to connect the respective set of tracks 40 with the set of common tracks 41.

The circuit of a scanner unit incorporating the switching apparatus is shown in FIG. 5. Groups of signals to be scanned are supplied to the scanner via contacts of an edge-connector 42 terminating the sets of tracks 40. Similarly, the common tracks 41 are terminated by an edge-connector 43 (which may be integral with the connector 42) through which connection is established with the apparatus intended to receive the scanned signals. In FIG. 5 this is shown as a digital voltmeter 44 which may have print-out facilities for recording the values of the scanned signals.

Energisation of the coils 17 is supervised by a controller-timer 45, which may, for example, cause the reed relays 15A and 15B to be actuated sequentially for one second each one second apart, once every hour. The controller-timer 45 triggers an energising circuit 46 to supply energising current to the track 39 via an edge-connector 47, and selectively connects the tracks 36A and 36B via an edge-connector 48 to earth in the appropriate sequence. A selector unit 49 coupled to the controller-timer 45 and the circuit 46 enables the coils 17 to be manually selected for energisation (for example, by pressing a selected push-button in the selector unit 49) so that any of the input data can be recorded at times other than those determined by the controller-timer 45.

The circuitry of the energising circuit 46 is shown in FIG. 6, in a form for implementation with CMos devices. The triggering signal from the controller-timer 45 for initiating energisation of a coil 17 is a short negative-going pulse, and is supplied to a monostable circuit 50 via a diode 51, and to an astable circuit 52 via a D-type bistable circuit 53.

The monostable circuit 50 comprises a two-input AND gate 54, one input of which is permanently connected to a five-volt positive supply (logic 1). The second input is connected to the anode of the diode 51, to the five-volt positive supply via a resistor 55, and to the output of the AND gate 54 via a resistor 56 and a capacitor 57 connected in series. A negative-going pulse applied via the diode 51 causes the AND gate 54 to change state so that its output goes to logic 0. This change is sustained by positive feedback via the capacitor 57. However, current flows into the capacitor 57 via the resistors 55 and 56, raising the voltage on the second input of the AND gate 54 until it reaches the logic 1 level again, whereupon the AND gate 54 reverts to its stable state with its output at logic 1.

The triggering pulse is supplied to the D-type bistable circuit 53 at its clock input, thereby causing the Q output to adopt the state of the D input, which is permanently connected to the five-volt positive (logic 1) supply. The Q output is connected in the astable circuit 52 to one input of a two-input NAND gate 58, the output of which is coupled to both inputs of a second two-input NAND gate 59, which therefore acts as an inverter. The output of the NAND gate 59 is coupled by a capacitor 60 and a resistor 61 to the second input of the NAND gate 58. A network, comprising a resistor 62 in series with a diode 63 and a resistor 64 in parallel, is connected between the output of the NAND gate 58 and the junction of the capacitor 60 and the resistor 61, the cathode of the diode 63 being connected to this junction.

When a logic 1 signal appears at the Q output of the bistable circuit 53, it co-operates with a logic 1 signal present at that time on the second input of the NAND gate 58 to cause that NAND gate to provide a logic 0 output. The capacitor 60 commences discharging through the resistors 62 and 64, until the voltage at the junction of the capacitor 60 and the resistor 61 has fallen to a value at which a logic 0 is present on the second input of the NAND gate 58. This NAND gate changes state again, provides a logic 1 output, and the NAND gate 59 inverts this so that a logic 0 is fed back via the capacitor 60 and the resistor 61 to sustain the change. The diode 63 is now forward-biased, so the capacitor 60 re-charges via the resistor 62 alone, until its voltage is sufficient to provide a logic 1 signal to the second input of the NAND gate 58, whereupon the cycle repeats. Oscillation continues until a signal is applied to the reset input of the D-type bistable circuit 53, by the controller-timer 45, to terminate energisation of a coil 17.

The duration of the quasi-stable state of the monostable circuit 50 (output of the AND gate 54 at logic 0) is determined by the values of the resistors 55 and 56 and the capacitor 57. Similarly, the frequency of oscillation of the astable circuit 52 is determined by the values of the capacitor 60 and the resistors 62 and 64. In particular, the output of the NAND gate 58 is at logic 0 for a time dependent on the sum of the values of the resistors 62 and 64, and at logic 1 for a time dependent on the value of the resistor 62 alone.

The outputs of the AND gate 54 and of the NAND gate 58 are connected to respective inputs of a NAND gate 65, which provides a logic 1 output when either input is at logic 0. This logic 1 output turns on a Darlington-pair transistor 66 which in turn switches on a p-n-p transistor 67 having its emitter electrode coupled to a 5.6 volt positive supply and its collector electrode coupled to a flywheel diode 68 and to the printed circuit track 39 via the edge-connector 47.

The printed circuit tracks 36A and 36B are coupled via the edge-connector 48 to the collector electrodes of respective Darlington-pair transistors 69A and 69B, the emitter electrodes of these transistors being at 0 volts and their base electrodes being connected to selection terminals 70A and 70B. A damping resistor 71 is connected to the 5.6 volt supply and, via respective diodes 72, to the collector electrodes of the transistors 69.

In operation, a trigger pulse is supplied to the energisation circuit 46 by the controller-timer 45, which at the same time energises the appropriate one of the selection terminals 70, say 70B. The monostable circuit 50 and the astable circuit 52 supply, respectively, a single, relatively long pulse (shown at 73 in FIG. 7), and then a succession of short pulses 74 of the same magnitude as each other and as the pulse 73. The energisation of the selection terminal 70B causes these pulses to flow through the association coil 17B and the transistor 69B, thereby actuating the reed relay 15B.

Between each pulse the flywheel diode 68 provides a path to sustain current flow through the coil 17B and the transistor 69B.

The diodes 72 provide a path for the flow of current so th at energy stored in the coils 17 can be dissipated rapidly when it is desired to terminate selection of a coil 17 and the associated transistor 69 is turned off. The damping resistor 71 limits the inductive voltage surge accompanying this process, which ensures rapid de-energisation of the reed relays 15.

The diodes 38 block spurious current paths when several scanner units are operated together in a multiplexed matrix mode.

The voltage magnitude of the pulses 73 and 74 is chosen to be several times the minimum necessary for actuation of the reed relays 15, to ensure rapid operation. The time-average voltage magnitude of the pulses 74, however, is chosen to be equal only to the voltage required to maintain actuation of the relays, that is, less than the minimum necessary for actuation. Because the energising circuit 46 provides at any one instant either no voltage or maximum voltage, there is no waste of power in voltage-dropping resistors as has been the case with known circuits. The average magnitude of the current caused by the pulses 74 is set to suit the coils 17 by selecting the values of the resistors 62 and 64, as explained above, to control the mark-space ratio of the pulses 74. Their pulse repetition frequency is typically 10 kHz, and is chosen to suit the inductance of the coils 17, and to avoid resonance and audible noise in the reed contact units 16.

In the example described, the magnitude of the pulse 73 is significantly larger than the pull-in voltage of the reed relays 15, and the average magnitude of the pulses 74 is equal only to the holding voltage (less than the pull-in voltage). This provides minimum speed of operation coupled with low power consumption. However, if maintenance of reed relay closure (despite vibration and mechanical shocks) is more important than low power consumption, the average magnitude of the pulses 74 could be increased to slightly more than the pull-in voltage of the reed relays 15 (but still less than the magnitude of the pulse 73). Alternatively, power consumption may be minimised by making the pulse 73 only slightly larger than the pull-in voltage and the average of the pulses 74 equal to the holding voltage.

The duration of the pulse 73 is typically 10 milliseconds, which is ample to ensure that the reed contact units 16 close. In these circumstances, the pulses 74 maintain the reed contact units 16 in the closed condition. However, the energising circuit 46 shown in FIG. 6 may also be used with other electromagnetically actuated devices, such as solenoid-operated print hammers in a print-out unit. In these circumstances, the pulse 73 would give a print hammer an initial impulse to overcome inertia and starting friction, and the pulses 74 would maintain the actuation (that is, movement) of the hammer until it struck the recording machine.

We claim:

1. Electrical switching apparatus for an electrical scanner unit, wherein a printed circuit board carries a plurality of reed relays each comprising an electric coil and at least one reed contact unit, wherein the coils are disposed on one surface of the board and the contact units are disposed on the other surface opposite their respective coils, and wherein screening means of substantially non-magnetic, electrically- and thermally-conductive material is disposed between each contact unit and its respective coil.

2. Apparatus as claimed in claim 1, wherein the screening means is of copper.

3. Apparatus as claimed in claim 1, wherein the screening means is disposed on said other surface of the board.

4. Apparatus as claimed in claim 1, wherein the screening means comprises part of the conductive cladding of the circuit board.

5. Apparatus as claimed in claim 1, wherein the screening means includes loops enclosing respective points of electrical connection of the reeds to the circuit board.

6. Apparatus as claimed in claim 1, wherein the board is a double-sided printed circuit board.

7. Apparatus as claimed in claim 6, wherein the screening means includes part of the conductive cladding on said one surface.

8. Apparatus as claimed in claim 1, wherein each coil has a plurality of reed contact units associated therewith.

9. Apparatus as claimed in claim 8, wherein a single, common screening means is provided between each coil and its associated reed contact units.

10. Apparatus as claimed in claim 1, wherein each coil is tubular.

11. Apparatus as claimed in claim 1, wherein each reed relay includes magnetic circuit means for transmitting the magnetic flux produced by the coil to the reed contact unit, and comprising two pole-pieces respectively positioned at opposite axial ends of the coil.

12. Apparatus as claimed in claim 11, wherein the pole-pieces also serve to mount the coil on the board.

13. Apparatus as claimed in claim 11, wherein the axis of each coil is parallel to the plane of the board, and the pole-pieces comprise respective plate-like members each lying in a plane perpendicular to said axis and each having a first bent-over portion which extends axially into the coil and a second bent-over portion which extends substantially parallel to said axis and towards the second bent-over portion of the other pole-piece, the reed contact unit being positioned on said other surface of the board parallel to and adjacent a line joining the second bent-over portions.

* * * * *